(12) United States Patent  (10) Patent No.: US 11,938,745 B2
Boulmay et al.  (45) Date of Patent: Mar. 26, 2024

(54) METHOD FOR STRUCTURING AN ANTI-COUNTERFEIT MARKING IN AN AT LEAST PARTIALLY TRANSPARENT OBJECT AND AT LEAST PARTIALLY TRANSPARENT OBJECT COMPRISING AN ANTI-COUNTERFEIT MARKING

(71) Applicant: Comadur SA, Le Locle (CH)

(72) Inventors: Alexis Boulmay, Valdahon (FR); Damien Le Boudouil, Morteau (FR)

(73) Assignee: Comadur SA, Le Locle (CH)

( * ) Notice: Subject to any disclaimer, the term of this patent is extended or adjusted under 35 U.S.C. 154(b) by 0 days.

(21) Appl. No.: 17/882,786

(22) Filed: Aug. 8, 2022

(65) Prior Publication Data

US 2023/0070336 A1  Mar. 9, 2023

(30) Foreign Application Priority Data

Sep. 8, 2021 (EP) ..................... 21195595

(51) Int. Cl.
*B41M 3/14* (2006.01)
*C03C 15/00* (2006.01)
(Continued)

(52) U.S. Cl.
CPC ............... *B41M 3/14* (2013.01); *C03C 15/00* (2013.01); *C03C 23/0055* (2013.01); *C09D 1/00* (2013.01);
(Continued)

(58) Field of Classification Search
None
See application file for complete search history.

(56) References Cited

U.S. PATENT DOCUMENTS 6,001,510 A * 12/1999 Meng ..................... G03H 1/041
430/1
2017/0205538 A1 * 7/2017 Furusato .................. G04C 3/14
(Continued)

FOREIGN PATENT DOCUMENTS

EP  0 802 462 A1  10/1997
EP  3 556 911 A1  10/2019
JP  2019-192633 A  10/2019

OTHER PUBLICATIONS

Shang et al. Research on Sapphire Deep Cavity Corrosion and Mask Selection Technology. Micromachines (Jan. 2021), 12, 136 (Year: 2021).*

(Continued)

*Primary Examiner* — Jose I Hernandez-Kenney
(74) *Attorney, Agent, or Firm* — Sughrue Mion, PLLC

(57) ABSTRACT

A method including obtaining an at least partially transparent object (1), providing a mask (6) defining at least one opening (8) wherein the contour corresponds to a profile of the anti-counterfeit marking to be structured, the mask (6) covering a surface of the at least partially transparent object (1) at the areas not to be structured, structuring the anti-counterfeit marking by bombarding the at least partially transparent object (1) by an ion beam (14) through the at least one opening (8) of the mask (6), the mechanical properties of the mask (6) being sufficient to prevent the ions of the ion beam (14) from etching the surface of the at least partially transparent object (1) at the areas where this surface is covered by the mask (6), removing the mask (6), and placing the at least partially transparent object (1) in a bath (16) at alkaline pH.

13 Claims, 2 Drawing Sheets

(51) Int. Cl.
    *C03C 23/00*     (2006.01)
    *C09D 1/00*     (2006.01)
    *C23C 14/06*     (2006.01)
    *C23C 16/34*     (2006.01)
    *C23C 16/513*     (2006.01)
    *G04D 3/00*     (2006.01)

(52) U.S. Cl.
    CPC .......... *C23C 14/0641* (2013.01); *C23C 16/34* (2013.01); *C23C 16/513* (2013.01); *G04D 3/0069* (2013.01); *C03C 23/006* (2013.01)

(56) References Cited

U.S. PATENT DOCUMENTS

2018/0217560 A1*   8/2018  Furusato .............. G04B 39/002
2019/0326088 A1*  10/2019  Boulmay ................ C30B 29/04
2021/0374495 A1*  12/2021  Ando .................... B82Y 40/00

OTHER PUBLICATIONS

Artem O. Larin et al., "Luminescent Erbium-Doped Silicon Thin Films for Advanced Anti-Counterfeit Labels", Advanced Materials, 2021, 9 pages. 2005886, vol. 33, No. 16.
European Search Report of No. 21 19 5595 dated Mar. 1, 2022.

* cited by examiner

METHOD FOR STRUCTURING AN ANTI-COUNTERFEIT MARKING IN AN AT LEAST PARTIALLY TRANSPARENT OBJECT AND AT LEAST PARTIALLY TRANSPARENT OBJECT COMPRISING AN ANTI-COUNTERFEIT MARKING

CROSS REFERENCE TO RELATED APPLICATIONS

This application is claiming priority based on European Patent Application No. 21195595.0 filed on Sep. 8, 2021, the disclosure of which is incorporated herein in its entirely by reference.

TECHNICAL FIELD OF THE INVENTION

The present invention relates to a method for structuring a pattern having a technical or decorative function in an at least partially transparent object. The present invention relates particularly to such a structuring method using a single- or multicharged ion beam. The present invention relates more specifically to a method for structuring a pattern in an object made of an at least partially transparent amorphous, semi-crystalline or crystalline material.

TECHNOLOGICAL BACKGROUND

In the field of the watchmaking industry in particular, combatting counterfeiting is an ongoing concern. For this reason, marking techniques are a valuable asset in combatting counterfeiting. In respect of anti-counterfeit marking in the field of watchmaking, two levels which are less identified by the marking techniques used than by the techniques used to read these markings are identified: indeed, it is necessary to be able to differentiate a genuine product from a counterfeit product without fail.

The first anti-counterfeit marking level corresponds to markings that can be identified by anyone without using any reading device. Although they can be identified by anyone, these markings such as holograms are no less dissuasive as they are complex to reproduce. These anti-counterfeit markings can also contribute to the aesthetics of the object whereon they are affixed. Level 1 anti-counterfeit markings can usually be identified with the naked eye. They can nevertheless involve other senses such as touch for example with a relief print.

The second marking level corresponds to markings which can only be identified using a reading device. Two options are then possible: either the marking such as a barcode is visible to the naked eye but the decoding thereof requires a reader. Such markings can be used to individualise batches, products and contain many other items of information. Or the marking is invisible. In this case, the marking can only be revealed using a reading device for example with infrared or ultraviolet by acting upon the light wavelength.

Paradoxically, the reassuring nature of visible or readily visible anti-counterfeit markings can play into the hands of counterfeiters as it can affect consumers' trust. The case of a counterfeit medicinal product including a hologram which sold better than the original medicinal product not including any is thus reported. The major flaw of anti-counterfeit markings identifiable by the consumer without the aid of a reading device is that they make it possible to immediately identify objects to be counterfeited. The counterfeiter will thus be able to easily compare their work with the original. Affixing a visible anti-counterfeit marking on an object without harming the aesthetics thereof can also prove to be problematic. Anti-counterfeit markings invisible to the naked eye are for their part more difficult to counterfeit, as counterfeiters first need to identify the presence thereof on the objects. The methods for making these markings are nevertheless often time-consuming and costly to implement. Furthermore, to reveal the presence of such invisible markings to the naked eye, it is most often necessary to have a specific decoder. This can therefore require sometimes sizable investments, particularly if it is sought to be able to test objects from different manufacturers and using different anti-counterfeit marking techniques in relation to each other. Most often, it is therefore not possible to guarantee that the suitable decoder is available when it is sought to ensure the authenticity of a given product.

SUMMARY OF THE INVENTION

The aim of the present invention is that of proposing a method for reliably and reproducibly structuring an anti-counterfeit marking in an at least partially transparent object.

For this purpose, the present invention relates to a method for structuring an anti-counterfeit marking in the thickness of an object made from an at least partially transparent amorphous, semi-crystalline or crystalline material, the at least partially transparent object comprising a top surface and a bottom surface which extends at a distance from the top surface, the method comprising the successive steps of:
  obtaining the bare at least partially transparent object;
  equipping one of the top or bottom surfaces of the at least partially transparent object with a mask which defines at least one opening wherein the contour corresponds to the profile of the anti-counterfeit marking to be structured, the mask covering the surface of the at least partially transparent object at the areas that are not to be structured;
  structuring the anti-counterfeit marking by bombarding the at least partially transparent object by means of a single- or multicharged ion beam through the at least one opening of the mask, the mechanical properties of the mask being sufficient to prevent the ions of the ion beam from etching the surface of the at least partially transparent object at the areas where this surface is covered by the mask;
  removing the mask;
  placing the at least partially transparent object in a bath at alkaline pH.

Thanks to these features, the present invention provides a method for producing an anti-counterfeit marking in the thickness of an at least partially transparent object reliably and reproducibly. Such a marking, imperceptible to the naked eye, can be revealed very simply, by illuminating it by means of a broad-spectrum light source, for example a light-emitting diode type light source. Indeed, by following the steps of the method according to the invention, an at least partially transparent object is obtained which, at the area where the anti-counterfeit marking has been structured, shows a variation of the reflectivity thereof which, although very slight, is nonetheless sufficient so that the marking can be detected when illuminated. Consequently, one of the noteworthy advantages of the invention is that there is no need to have specific and often costly equipment to be able to ensure the authenticity of an object marked according to the teachings of the invention. A mere commercially available broad-spectrum light source is sufficient. Moreover, the anti-counterfeit marking obtained thanks to the method according to the invention is tamper-proof. In the case where such a marking is for example structured in a sapphire watch crystal, the only way to alter this marking is to polish the crystal using a diamond paste or to melt this crystal.

According to a specific embodiment of the method according to the invention, at least one anti-reflection coat is deposited on at least one of the top or bottom surfaces of the object.

According to another specific embodiment of the method according to the invention, the at least partially transparent object is made of sapphire, ruby or diamond, preferably synthetic.

According to another specific embodiment of the method according to the invention, the at least partially transparent object is made of a semi-crystalline organic material.

According to another specific embodiment of the method according to the invention, the at least partially transparent object is made of mineral glass or of an amorphous organic material.

According to another specific embodiment of the invention, the at least partially transparent object is pre-washed.

According to another specific embodiment of the method according to the invention, the single- or multicharged ion beam is produced by an ECR electron cyclotron resonance type single- or multicharged ion source.

According to another specific embodiment of the invention, the ions are accelerated at a voltage between 10 kV and 40 kV and the ion implantation dose is between $3 \times 10^{16}$ and $6 \times 10^{16}$ ions/cm2.

According to another specific embodiment of the invention, the ions are accelerated at a voltage between 10 kV and 40 kV and the ion implantation dose is between $3.10^{16}$ and $6.10^{16}$ ions/cm$^2$.

According to another specific embodiment of the invention, the at least partially transparent object is bombarded using nitrogen N ions accelerated at a voltage of 28 kV for a duration of 1.53 s/cm$^2$, the ion implantation dose being $33.5 \times 10^{16}$ ions/cm$^2$ and the ion beam intensity being 5.5 mA.

According to another specific embodiment of the invention, the mask is a sheet of material wherein the contour of the anti-counterfeit marking has been blanked, this sheet of material then being fastened to the top surface of the at least partially transparent object wherein it is sought to structure the pattern.

According to other specific embodiments of the invention:
- the mask deposited on the surface of the at least partially transparent object is a metallic coat created by metallisation;
- the metallisation is carried out by vapour deposition by means of one of the following techniques: Physical Vapour Deposition (PVD), Chemical Vapour Deposition (CVD), Plasma-Enhanced Chemical Vapour Deposition;
- the metallic coat is a coat of chromium nitride CrN wherein the thickness is between 1 and 1500 nm;
- the at least one opening wherein the contour corresponds to the profile of the anti-counterfeit marking to be structured in the at least partially transparent object is arranged in the metallic coat by photolithography.

According to another specific embodiment of the invention, the at least partially transparent object is a watch crystal.

BRIEF DESCRIPTION OF THE FIGURES

Further features and advantages of the present invention will emerge more clearly from the following detailed description of an example of embodiment of the method according to the invention, this example being given purely by way of illustration and not merely limitation, with reference to the appended drawing wherein.

DETAILED DESCRIPTION OF THE INVENTION

Figure 1:
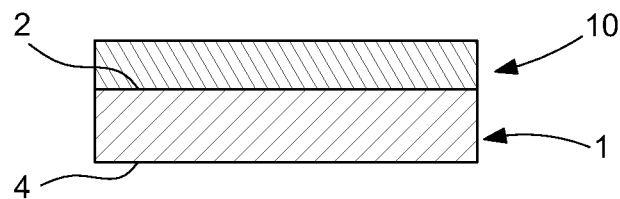
FIG. 1 is a sectional view of a watch crystal on a top surface of which a masking coat is deposited.

The present invention proceeds from the general inventive concept which consists of proposing an anti-counterfeit marking method of an at least partially transparent object capable of being integrated without any particular difficulty in a large-scale production cycle. Moreover, the markings structured in accordance with the method according to the invention, invisible to the naked eye, can be detected by means of a mere broad-spectrum light source that practically everyone has. It is therefore not necessary, to be able to authenticate objects marked according to the invention, to have specific decoders that are often costly and the presence of which at the location where inspections are to be performed is not always guaranteed. Similarly, the anti-counterfeit markings produced in accordance with the invention are virtually inalterable, destruction of the marked object being often the only solution to remove these markings.

In the following example, the structuring according to the method according to the invention of an anti-counterfeit marking in a sapphire watch crystal is described. Obviously, this example is given merely for illustrative and not restrictive purposes and the present method can be applied to the marking of any at least partially transparent object made of an amorphous, semi-crystalline or crystalline material.

Designated as a whole by the general reference number 1, the watch crystal, made of sapphire, comprises a top surface 2 and a bottom surface 4 which extends at a distance from the top surface 2. In the example represented in the drawing, the anti-counterfeit marking is produced in the top surface 2 of the watch crystal 1. Obviously, this anti-counterfeit marking could just as well be produced in the bottom surface 4 of this watch crystal 1.

After having obtained such a watch crystal 1, one starts by equipping the top surface 2 thereof with a mask 6 which will define at least one opening 8 wherein the contour will correspond to the anti-counterfeit marking profile intended to be structured in the thickness of the watch crystal 1. According to a first embodiment of the invention not shown in the drawing, the mask 6 is a separate sheet of material wherein the contour of the anti-counterfeit marking has been blanked, this sheet of material then being fastened to the top surface 2 of the watch crystal 1.

According to the preferred embodiment of the method according to the invention, the mask 6 is produced by photolithography directly on the top surface 2 of the watch crystal 1. For this purpose, one starts by covering the top surface 2 of the watch crystal 1 with a masking coat 10 of a material from which the mask 6 must be made (see FIG. 1). Of a thickness preferably between 1 and 1500 nm, the masking coat 10 can be produced by vapour deposition of a metallic material such as chromium nitride $CrxN_y$, for example CrN, by means of one of the following techniques: Physical Vapour Deposition or PVD, Chemical Vapour Deposition or CVD, or Plasma-Enhanced Chemical Vapour Deposition or PECVD.

Figure 2:
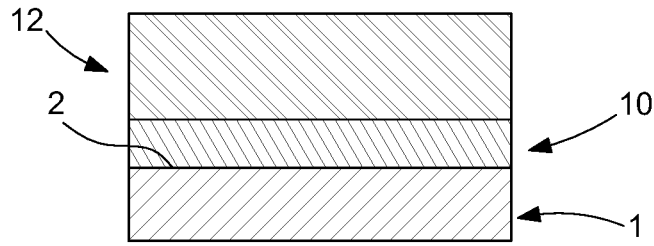
FIG. 2 is a sectional view of the watch crystal in FIG. 1 wherein the masking coat is covered with a coat of photosensitive resin.
Figure 3:
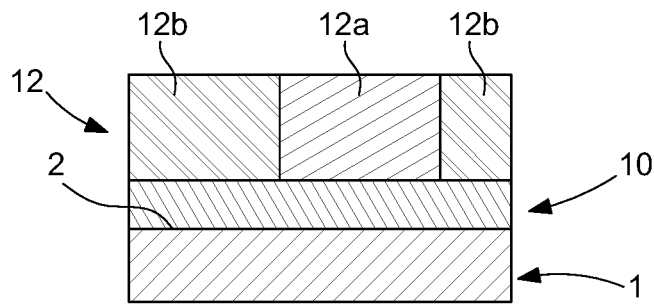
FIG. 3 is a sectional view of the watch crystal in FIG. 2 wherein the coat of photosensitive resin is exposed to light, only the parts of this coat of photosensitive resin exposed to light polymerising.
Figure 4:
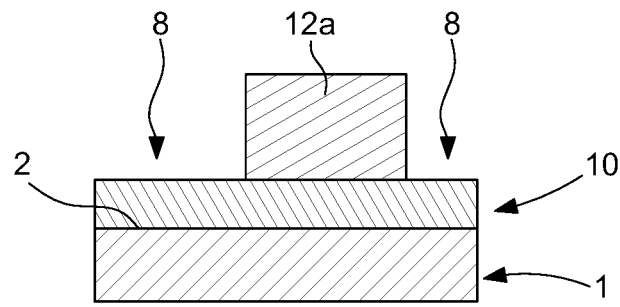
FIG. 4 is a sectional view of the watch crystal in FIG. 3 which illustrates the development of the coat of photosensitive resin, only the parts of this coat of photosensitive resin exposed to light remaining, whereas the parts not exposed to light have been removed.
Figure 5:
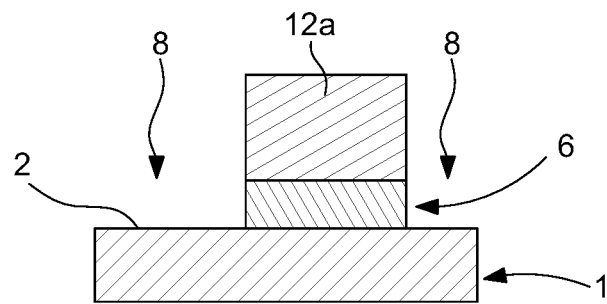
FIG. 5 is a sectional view of the watch crystal in FIG. 4 wherein the parts of the masking coat not covered with the coat of photosensitive resin exposed to light have been removed.
Figure 6:
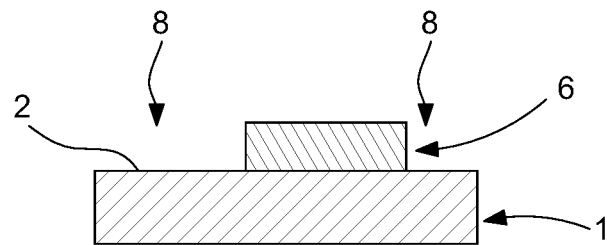
FIG. 6 is a sectional view of the watch crystal in FIG. 5 wherein the remains of the coat of photosensitive resin are in turn removed, the top surface of the watch crystal being covered by areas of the masking layer which forms the mask wherein the contour of the openings corresponds to the profile of the anti-counterfeit marking to be structured in the thickness of the watch crystal.

Once the masking coat 10 has been deposited, it is covered with a coat of photosensitive resin 12 (see FIG. 2). This coat of photosensitive resin 12 is then exposed to light, such that only the parts of this coat of photosensitive resin 12 exposed to light polymerise (see FIG. 3). After that, the coat of photosensitive resin 12 is developed, only the parts 12a of this coat of photosensitive resin 12 exposed to light remaining, whereas the parts 12b not exposed to light are removed (see FIG. 4). Finally, the parts of the masking coat 10 not covered by the coat of photosensitive resin 12 are removed, for example by chemical etching (see FIG. 5), then the parts 12a of the coat of photosensitive resin 12 which have been exposed to light are in turn removed. Thus a watch crystal 1 is obtained wherein the top surface 2 is covered by areas of the masking coat 10 which forms the mask 6 wherein the contour of the opening(s) 8 corresponds to the anti-counterfeit marking profile to be structured in the thickness of the watch glass 1 (see FIG. 6).

Figure 7:
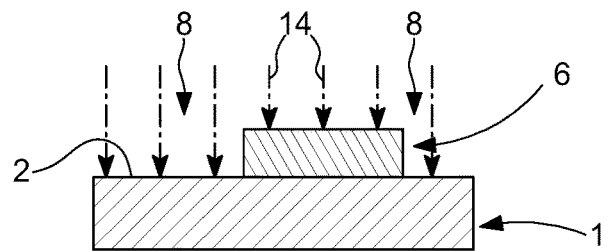
FIG. 7 is a sectional view of the crystal in FIG. 6 wherein the anti-counterfeit marking of the watch crystal is produced by bombarding the watch crystal using an ion beam through the openings of the mask.

Once the masking coat 10 has been suitably structured by photolithography to form the mask 6, the anti-counterfeit marking of the watch crystal 1 is performed. For this purpose (see FIG. 7), the watch crystal 1 is bombarded by means of a single- or multicharged ion beam 14 through the at least one opening 8 of the mask 6, the mechanical properties of this mask 6 being sufficient to prevent the ions of the ion beam 14 from etching the surface 2 of the watch crystal 1 at the areas where this top surface 2 is covered by the mask 6. According to the preferred embodiment of the method according to the invention, the watch crystal 1 is bombarded using nitrogen N, oxygen O, helium He, carbon C, argon Ar, xenon Xe or carbon C ions obtained by ionising carbon tetrafluoride $CF_4$ or methane $CH_4$. To accelerate these ions, an ECR electron cyclotron resonance type single- or multicharged ion source can be used. Preferably, the ions are accelerated at a voltage between 10 kV and 40 kV and the ion implantation dose is between $3.10^{16}$ and $6.10^{16}$ ions/$cm^2$. In the specific case wherein the watch crystal 1 is bombarded using nitrogen N ions, the latter are accelerated at a voltage of 28 kV for a duration of 1.53 s/$cm^2$, the ion implantation dose being $3.5.10^{16}$ ions/$cm^2$ and the ion beam intensity being 5.5 mA.

Figure 8:
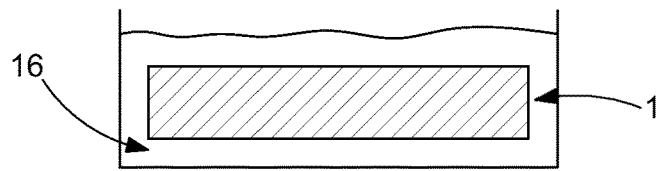
FIG. 8 is a sectional view of the watch crystal in FIG. 7 placed in a bath at alkaline pH.

After ion bombardment of the watch crystal 1 to structure in the thickness thereof the desired anti-counterfeit marking, the mask 6 is removed, then the watch crystal 1 is placed in a bath 16 with an alkaline pH (see FIG. 8). An example of a suitable bath wherein the watch crystal 1 can be placed after structuring the anti-counterfeit marking is given by the product marketed by Borer under the reference deconex OP 141. It consists of a potassium hydroxide-based solution wherein the pH is equal to 13.

Figure 9:
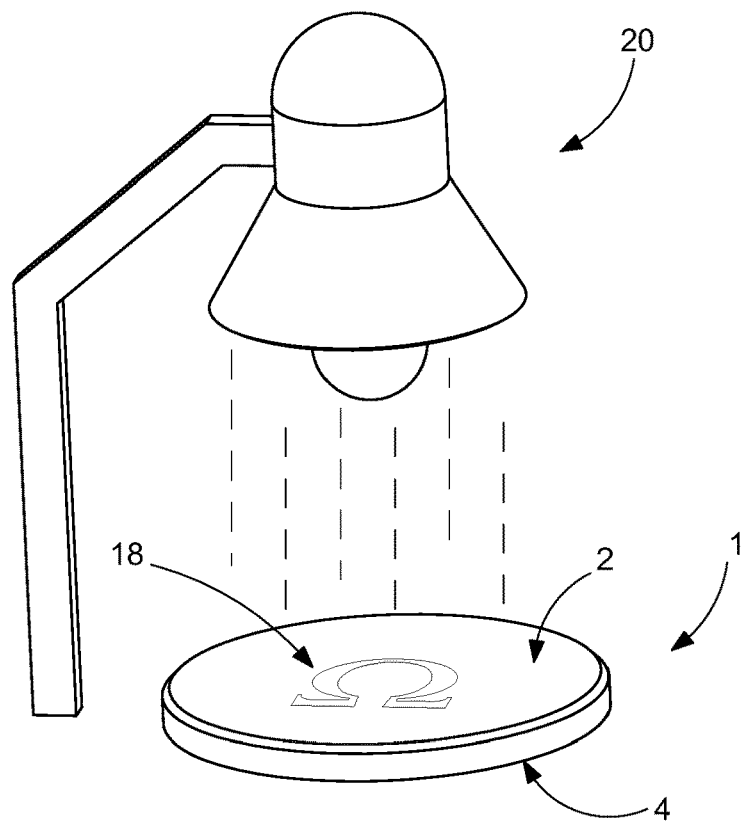
FIG. 9 illustrates the detection of the anti-counterfeit marking using a light source.

The anti-counterfeit marking 18 obtained according to the method according to the invention is imperceptible to the naked eye but can be revealed very simply, by illuminating it by means of a broad-spectrum light source 20, for example a light-emitting diode type light source (see FIG. 9). Indeed, by following the steps of the method according to the invention, a transparent watch crystal 1 is obtained which, at the area where the anti-counterfeit marking 18 has been structured, shows a variation of the reflectivity thereof which, although very slight, is nonetheless sufficient so that the anti-counterfeit marking 18 can be detected when illuminated by means of a light source 20. Consequently, one of the noteworthy advantages of the invention is that there is no need to have specific and often costly equipment to be able to ensure the authenticity of an object marked according to the teachings of the invention. For example, the light source 20 suitable for the needs of the invention is the lamp for universal use marketed by TANEO under the reference STZL 24 R wherein the white colour temperature is between 4700 and 5300° K.

Before structuring the anti-counterfeit marking, the watch crystal 1 can be pre-washed in order to degrease it.

Figure 10:
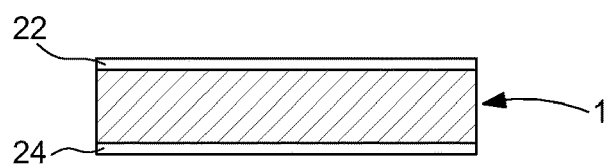
FIG. 10 is a sectional view of the watch crystal on the front and rear faces whereof anti-reflection coats have been deposited.

After structuring the anti-counterfeit marking in the thickness of the watch crystal 1, it is furthermore possible to deposit one or more anti-reflection coats 22, 24 on one and/or the other of the top 2 or bottom 4 faces of the water crystal 1 (see FIG. 10). The anti-reflection coat(s) 22, 24 are produced for example using silica ($SiO_2$) or magnesium fluoride ($MgF_2$). It is possible to combine coats made of silica with coats made of magnesium fluoride. The thickness of these coats considered individually does not usually exceed 150 nm. Other materials such as titanium, tantalum, zirconium, silicon and aluminium oxides as well as silicon nitride can also be used for producing the anti-reflection coats. These anti-reflection coats 22, 24 can be deposited by vapour deposition. Among the deposition techniques that can be envisaged, mention can be made of physical vapour deposition (PVD), chemical vapour deposition (CVD), plasma-enhanced chemical vapour deposition (PECVD), or atomic layer deposition or ALD. It is possible to combine coats made of silica with coats made of magnesium fluoride. The thickness of these coats considered individually does not usually exceed 150 nm. Other materials such as titanium, tantalum, zirconium, silicon and aluminium oxides as well as silicon nitride can also be used for producing the anti-reflection coats.

It is obvious that the present invention is not limited to the embodiment just described and that various modifications and simple variants can be envisaged without departing from the scope of the invention as defined by the appended claims. In particular, the invention has just been described with reference to a watch crystal made of sapphire. It is nonetheless obvious that the invention is not limited to this specific embodiment and that it is applicable to any type of at least partially transparent object made of sapphire, ruby or diamond, preferably synthetic. The invention also applies to at least partially transparent objects made of a semi-crystalline organic material such as mineral glass or made of an amorphous organic material.

LIST OF REFERENCES

1. Watch crystal
2. Top surface
4. Bottom surface
6. Mask
8. Openings
10. Masking coat
12. Coat of photosensitive resin
12a. Parts of the coat of photosensitive resin exposed to light
12b. Parts of the coat of photosensitive resin not exposed to light
14. Ion beam
16. Bath
18. Anti-counterfeit marking
20. Light source
22, 24. Anti-reflection coats

The invention claimed is:

1. A method for structuring an anti-counterfeit marking (18) in the thickness of an at least partially transparent object (1) made from an at least partially transparent amorphous, semi-crystalline or crystalline material, the at least partially transparent object (1) comprising a top surface (2) and a bottom surface (4) which extends at a distance from the top surface (2), the method comprising the successive steps of:

obtaining the at least partially transparent object (1);
providing one of the top (2) or bottom (4) surfaces of the at least partially transparent object (1) with a mask (6) which defines at least one opening (8) wherein the contour corresponds to the profile of the anti-counterfeit marking to be structured, the mask (6) covering the surface of the at least partially transparent object (1) at the areas that are not to be structured;
structuring the anti-counterfeit marking by bombarding, using nitrogen N ions accelerated at a voltage of 28 kV for a duration of 1.53 s/cm2 and with the ion implantation dose being $3.5\times10^{16}$ ions/cm$^2$ and with the ion beam intensity being 5.5 mA, the at least partially transparent object (1) by a single- or multicharged ion beam (14) through the at least one opening (8) of the mask (6), the mechanical properties of the mask (6) being sufficient to prevent the ions of the ion beam (14) from etching the surface of the at least partially transparent object (1) at the areas where this surface is covered by the mask (6);
removing the mask (6);
placing the at least partially transparent object (1) in a bath (16) at alkaline pH.

2. The method according to claim 1, further comprising depositing at least one anti-reflection coat (22, 24) on at least one of the top (2) or bottom (4) surfaces.

3. The method according to claim 1, wherein the at least partially transparent object (1) is made of sapphire, ruby or diamond.

4. The method according to claim 1, wherein the at least partially transparent object (1) is made of a semi-crystalline organic material.

5. The method according to claim 1, wherein the at least partially transparent object (1) is made of mineral glass or of an amorphous organic material.

6. The method according to claim 1, wherein the at least partially transparent object (1) is pre-washed.

7. The method according to claim 1, further comprising producing the single- or multicharged ion beam (14) by an ECR electron cyclotron resonance single- or multicharged ion source.

8. The method according to claim 1, wherein the mask (6) is a sheet of material wherein the contour of the anti-counterfeit marking has been blanked, this sheet of material then being fastened to the top (2) or bottom (4) surface of the at least partially transparent object (1) wherein it is sought to structure the pattern.

9. The method according to claim 1, wherein the at least partially transparent object (1) is a watch crystal.

10. The method according to claim 1, further comprising creating the mask (6) as a metallic coat by metallisation.

11. The method according to claim 10, wherein the metallisation is carried out by vapour deposition by means of one of the following techniques: Physical Vapour Deposition (PVD), Chemical Vapour Deposition (CVD), Plasma-Enhanced Chemical Vapour Deposition.

12. The method according to claim 11, wherein the metallic coat is a coat of chromium nitride CrN wherein the thickness is between 1 and 1500 nm.

13. The method according to claim 10, wherein the at least one opening (14) wherein the contour corresponds to the profile of the anti-counterfeit marking to be structured in the at least partially transparent object (1) is arranged in the metallic coat by photolithography.

* * * * *